(12) United States Patent
Motonishi et al.

(10) Patent No.: US 7,095,590 B2
(45) Date of Patent: Aug. 22, 2006

(54) HEAD GIMBAL ASSEMBLY AND METHOD FOR MANUFACTURING THE SAME

(75) Inventors: Michiharu Motonishi, Niigata-ken (JP); Mitsuru Watanabe, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 211 days.

(21) Appl. No.: 10/681,474

(22) Filed: Oct. 8, 2003

(65) Prior Publication Data
US 2004/0075946 A1    Apr. 22, 2004

(30) Foreign Application Priority Data
Oct. 18, 2002    (JP)    ............... 2002-304632

(51) Int. Cl.
*G11B 21/20*    (2006.01)
(52) U.S. Cl. .................................. 360/234.6
(58) Field of Classification Search ............. 360/234.6
See application file for complete search history.

(56) References Cited

U.S. PATENT DOCUMENTS 5,499,153 A * 3/1996 Uemura et al. .......... 360/234.6

| 5,499,668 A | 3/1996 | Katayama et al. |
| 5,809,534 A | 9/1998 | Inaba |
| 6,078,472 A | 6/2000 | Mitoh et al. |

FOREIGN PATENT DOCUMENTS

| JP | 7-171689 | 7/1995 |
| JP | 11-149625 | 6/1996 |
| JP | 2001-196420 | 7/2000 |
| JP | 2000-215428 | 8/2000 |
| JP | 2001-309673 | 11/2001 |

OTHER PUBLICATIONS

Copy of Notification of Reasons for Refusal from corresponding Japanese patent application No. 2002-304632, May 24, 2005.

* cited by examiner

*Primary Examiner*—A. J. Heinz
*Assistant Examiner*—Mark Blouin
(74) *Attorney, Agent, or Firm*—Brinks Hofer Gilson & Lione

(57) ABSTRACT

A head gimbal assembly has a gimbal suspension that includes a metal flexure bonded to a slider having a magnetic head element. This head gimbal assembly prevents damage from electrostatic discharge more efficiently. In the head gimbal assembly, a region of an oxide film on a slider-bonding surface of the flexure is completely or incompletely removed to form a film-removed region, and conductive adhesive resin is disposed between the film-removed region and the slider.

20 Claims, 6 Drawing Sheets

HEAD GIMBAL ASSEMBLY AND METHOD FOR MANUFACTURING THE SAME

This application claims the benefit of priority to Japanese Patent Application 2002-304632, filed on Oct. 18, 2002.

BACKGROUND OF THE INVENTION

1. Field of the Invention

The present invention relates to head gimbal assemblies (HGAs) and methods for manufacturing the head gimbal assemblies.

2. Description of the Related Art

Head gimbal assemblies are widely used for hard disc drives (HDDs). Such a head gimbal assembly includes a load beam, a metal flexure fixed on the leading end of the load beam, and a slider bonded on an end of the flexure. This slider has a thin film magnetic head element such as a magnetoresistive element (MR element) or a giant magnetoresistive element (GMR element). In this head gimbal assembly, a charged slider may cause electrostatic discharge (ESD), which damages the magnetic head element on the slider. To solve this problem, conductive adhesive resin is conventionally disposed between the flexure and the slider to dissipate the charge of the slider into a suspension. In addition, the breakdown voltage of the slider (the magnetic head element) has further decreased in recent years. Accordingly, a metal film is deposited on the bottom surface (a surface bonded to the suspension) of the slider (metalization) to decrease the contact resistance between the suspension and the slider.

However, these conventional measures are insufficient to prevent the electrostatic discharge; in fact, the electrostatic discharge unfortunately damages the magnetic head element at a constant rate.

In the process of manufacturing the above head gimbal assembly, an oxide film is formed on a surface of the flexure, which is made of a metal spring material (typically, stainless steel). Detailed observations of a head gimbal assembly damaged from the electrostatic discharge revealed that the oxide film prevents the decrease in the contact resistance between the flexure and the slider. This resulted in the present invention.

SUMMARY OF THE INVENTION

An object of the present invention, therefore, is to provide a head gimbal assembly and its manufacturing method for preventing damage from electrostatic discharge more efficiently.

The present invention provides a head gimbal assembly having a gimbal suspension that includes a metal flexure bonded to a slider having a magnetic head element. A region of an oxide film on a slider-bonding surface of the flexure is completely or incompletely removed to form a film-removed region. Conductive adhesive resin is then disposed between the film-removed region and the slider.

The present invention further provides a method for manufacturing a head gimbal assembly having a gimbal suspension that includes a metal flexure bonded to a slider having a magnetic head element. The method includes the steps of forming a film-removed region by completely or incompletely removing a region of an oxide film on a slider-bonding surface of the flexure; and bonding the film-removed region and the slider with conductive adhesive resin.

Thus, bonding the slider to the film-removed region of the slider-bonding surface of the flexure with the conductive adhesive resin allows a significant decrease in the contact resistance. This prevents the damage from the electrostatic discharge. Mechanical scratching is the easiest way to form the film-removed region. The slider, if mechanically scratched in the atmosphere, is preferably bonded to the flexure with the conductive adhesive resin immediately after the scratching (before formation of the oxide film). The mechanical scratching and the bonding are more preferably carried out in an inert atmosphere.

The film-removed region may be formed by laser irradiation or electrical discharge in an inert atmosphere. This prevents re-formation of the oxide film, which is more persistent, at a laser-irradiated or discharge-machined region. The flexure and the slider are most preferably bonded with the conductive adhesive resin in the same inert atmosphere immediately after the laser irradiation or the discharge. However, experimental results show that re-formation of the oxide film on the film-removed region takes several days or weeks. Therefore, a certain amount of decrease in the contact resistance is ensured by bonding the slider to the film-removed region in the atmosphere as soon as possible after the removal of the oxide film by the laser irradiation or the discharge.

Accordingly, the present invention provides a head gimbal assembly having a gimbal suspension that includes a metal flexure bonded to a slider having a magnetic head element. This head gimbal assembly prevents electrostatic discharge more efficiently, which damages the magnetic head element. The present invention further provides a method for manufacturing the head gimbal assembly.

DESCRIPTION OF THE PREFERRED EMBODIMENTS

Figure 1:
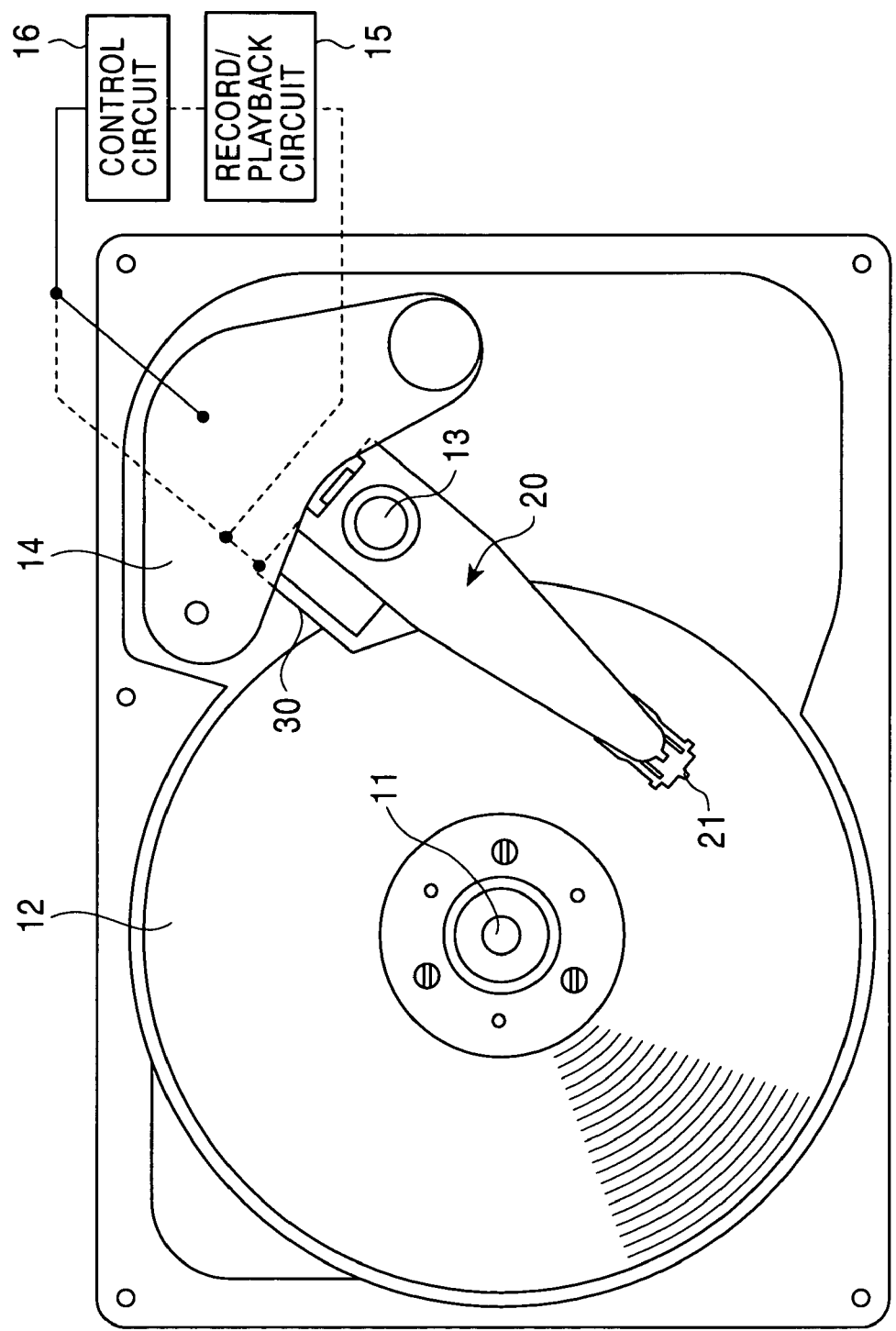
FIG. 1 is a plan view of a hard disc drive having a head gimbal assembly according to the present invention.

FIG. 1 shows the entire structure of a hard disc drive having a head gimbal assembly according to the present embodiment. A hard disc 12, which is a magnetic disc, rotates around a rotating shaft 11. Another rotating shaft 13, which is disposed adjacent to the hard disc 12, supports the base of a gimbal suspension 20. This gimbal suspension 20 is rotatable around the rotating shaft 13. A free end of the gimbal suspension 20 is bonded to a slider 21 having a thin film magnetic head element such as a magnetoresistive element or a giant magnetoresistive element. When an actuator 14 rotates the gimbal suspension 20 around the rotating shaft 13, the slider 21 reciprocates substantially in the radial direction of the hard disc 12.

Figure 2:
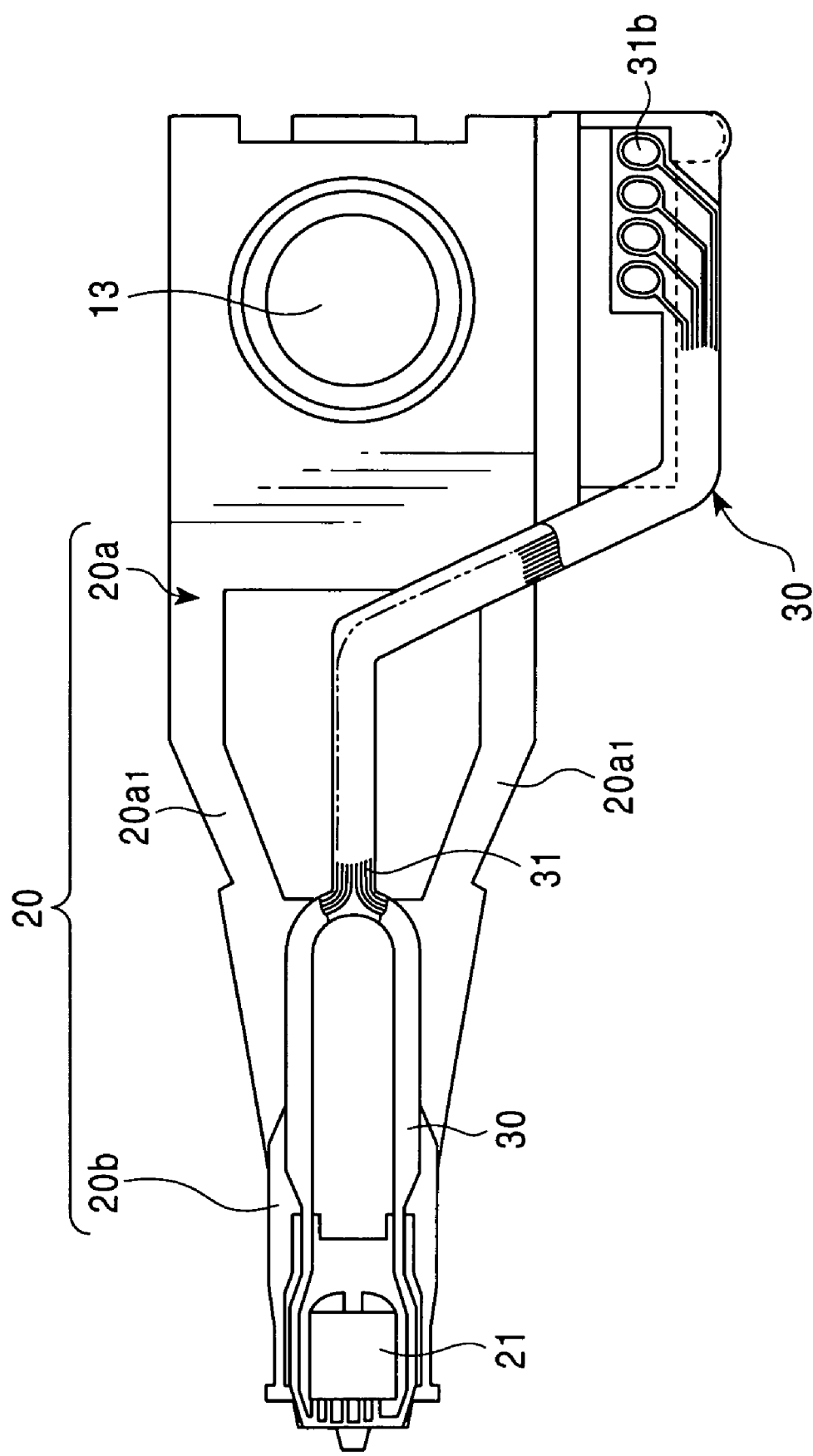
FIG. 2 is a back view of the head gimbal assembly (gimbal suspension) in FIG. 1.
Figure 3:
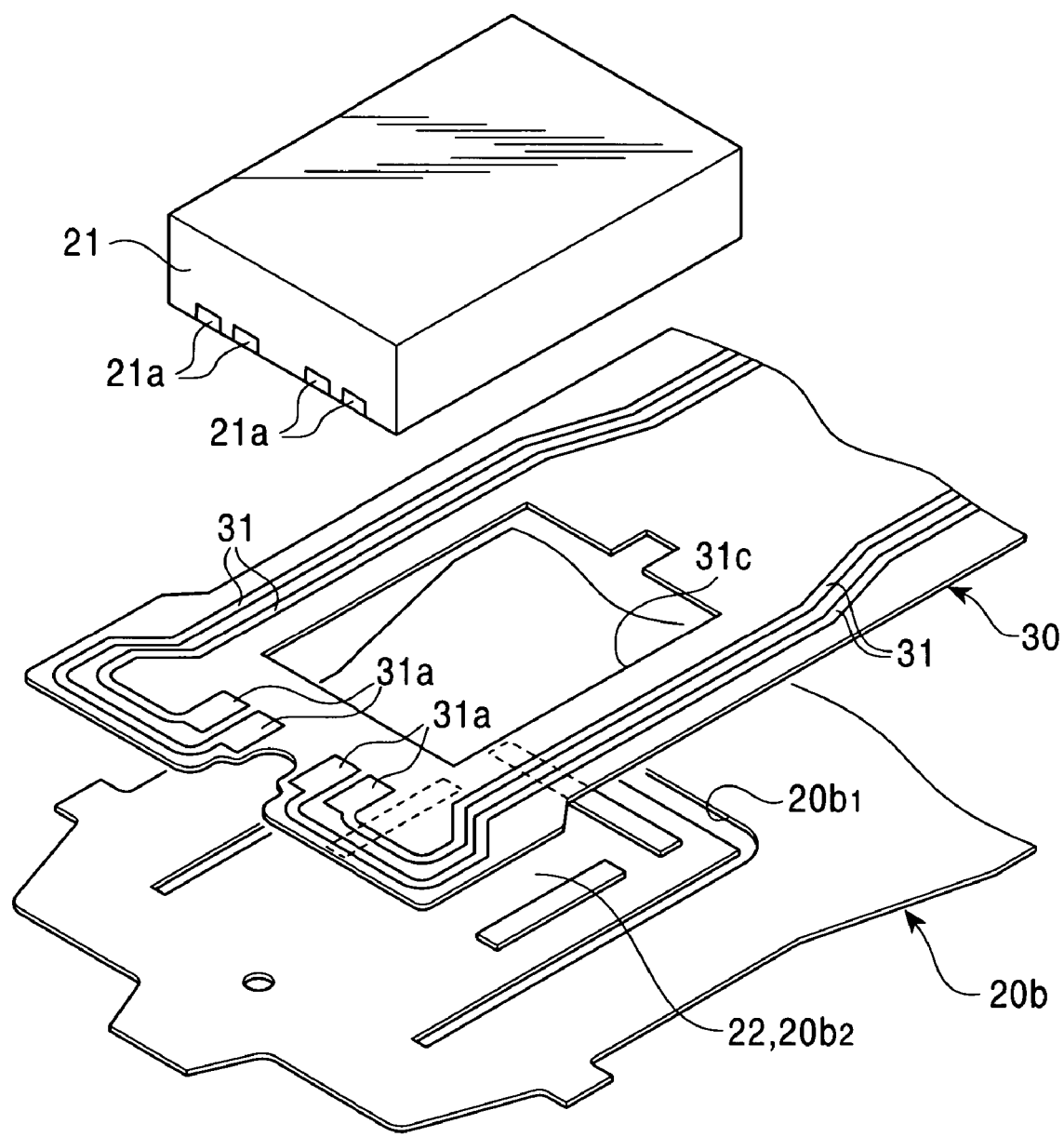
FIG. 3 is an exploded perspective view of a gimbal suspension, a flexible printed circuit board (FPC board), and a slider on the leading end of the head gimbal assembly in FIGS. 1 and 2.

Referring to FIG. 2, the gimbal suspension 20 includes a load beam 20a, which is the base of the gimbal suspension 20 supported by the rotating shaft 13, and a stainless-steel flexure (flexure base) 20b, which is laser-welded to the leading end of the load beam 20a. This load beam 20a has an elastic forked portion 20a1, which is connected to the flexure 20b. Referring to FIG. 3, the leading end of the flexure 20b has a U-shaped through groove 20b1, which forms an elastic slider-bonding tongue 20b2 (a slider-bonding surface 22).

This gimbal suspension 20 holds a flexible printed circuit board 30. For convenience, FIG. 3 separately illustrates the gimbal suspension 20 and the flexible printed circuit board 30. The flexible printed circuit board 30 is made of a resin base laminated with trace lines 31. Ends of the trace lines 31 adjacent to the slider 21, as shown in FIG. 3, are provided with connection terminals 31a, which are connected to terminals 21a of the slider 21 (the magnetic head element) by, typically, gold bonding. The other ends of the trace lines 31 adjacent to the rotating shaft 13, as shown in FIG. 2, are provided with base connection terminals 31b, which are connected to a record/playback circuit 15 and a control circuit 16, as shown in FIG. 1. The control circuit 16 transmits a control signal for controlling the actuator 14. The slider 21 (the magnetic head element) communicates a record or playback signal with the record/playback circuit 15 and inputs a tracking signal received from the hard disc 12 into the control circuit 16. The control circuit 16 controls the actuator 14 to adjust the tracking position of the gimbal suspension 20 (the slider 21).

In such a head gimbal assembly, the slider 21, for example, is bonded to the flexure 20b (the slider-bonding tongue 20b2) of the gimbal suspension 20 at least at one position using conductive adhesive resin. In the present embodiment, a region of an oxide film on a surface of the flexure 20b is completely or incompletely removed to form a film-removed region, and then the conductive adhesive resin is disposed between the film-removed region and the slider 21. This sufficiently decreases the contact resistance using the conductive adhesive resin.

The flexure 20b, which is made of a metal such as stainless steel, is typically manufactured in the atmosphere. Therefore, an oxide film is inevitably formed on a surface of the flexure 20b. This oxide film, which is significantly thin (for example, about 60 to 70 Å), has not been thought to affect the contact resistance between the flexure 20b and the slider 21. In other words, the conductive adhesive resin between the flexure 20b and the slider 21 has been thought to allow a sufficient decrease in the contact resistance.

However, an analysis by the present inventors revealed that the oxide film, which is inevitably formed during the manufacture of the flexure 20b, actually affects the contact resistance between the flexure 20b and the slider 21. The withstand voltage of the magnetic head element on the slider 21 has been decreasing with narrower tracks. This oxide film prevents the decrease in the contact resistance using the conductive adhesive resin, thus leading to the damage from the electrostatic discharge.

Figure 4:
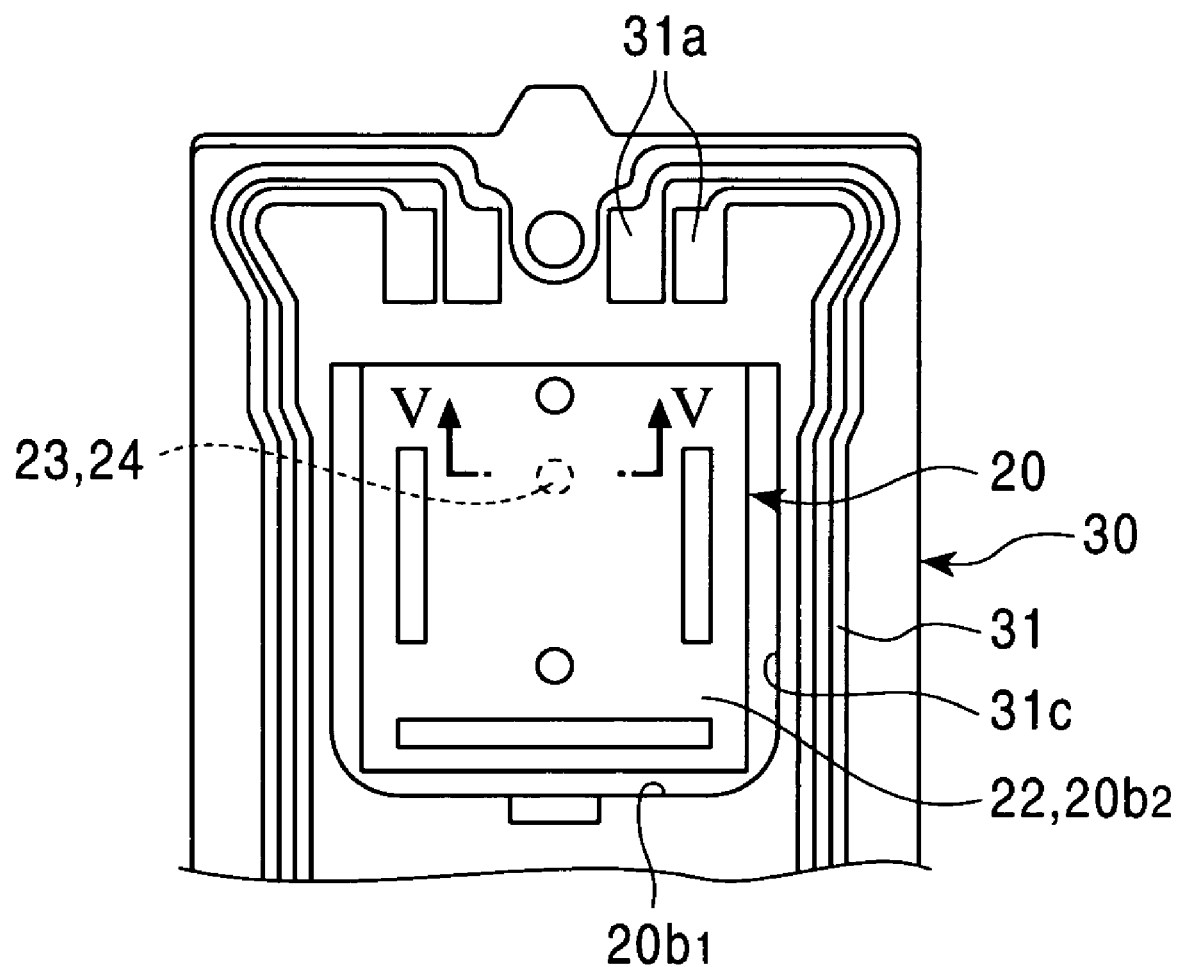
FIG. 4 is a back view of the head gimbal assembly and the flexible printed circuit board before bonded to the slider.
Figure 5A:
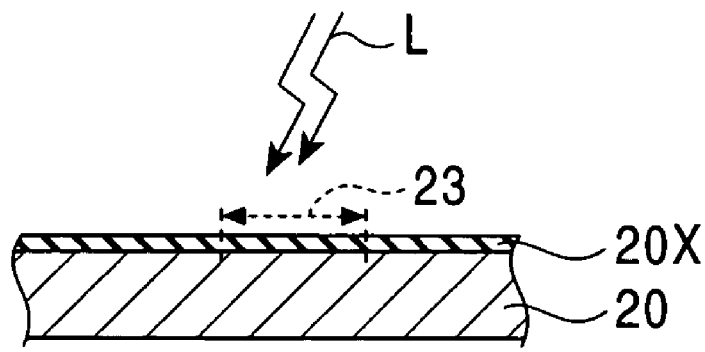
FIGS. 5A, 5B, and 5C are sectional views taken along line V—V of FIG. 4 in each processing step.
Figure 5B:
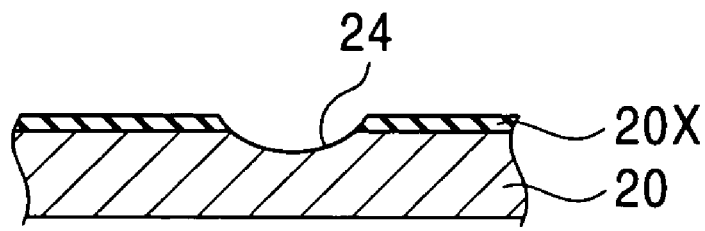
Figure 5C:
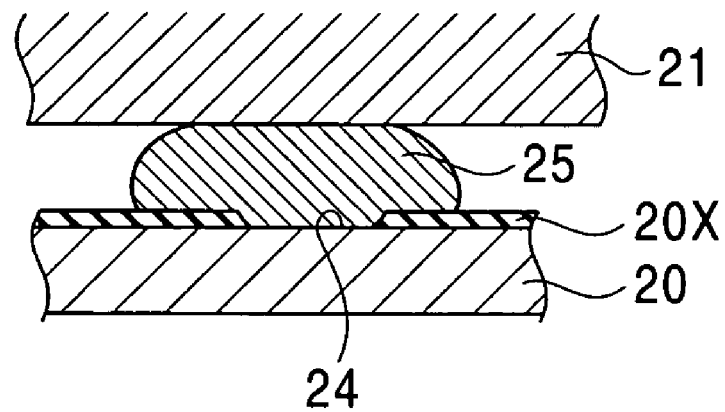

FIGS. 4, 5A, 5B and 5C show a first embodiment of the present invention. Referring to FIG. 4, the leading end of the flexure 20b, as described above, has the U-shaped through groove 20b1, which forms the slider-bonding tongue 20b2 (the slider-bonding surface 22). This slider-bonding surface 22 is exposed from an opening 31c in the flexible printed circuit 30. In the present embodiment, a region of the slider-bonding surface 22 is designated as a laser-irradiation region 23 (a region for bonding with the conductive adhesive resin). Referring to FIG. 5A, this laser-irradiation region 23 is irradiated with laser light L in an inert atmosphere (for example, a nitrogen atmosphere). Referring to FIG. 5B, an oxide film 20X on the flexure 20b is completely or incompletely removed at the laser-irradiation region 23 to form a film-removed region 24. Referring to FIG. 5C, conductive adhesive resin 25 is applied dropwise on this film-removed region 24 and then is pressed with the slider 21 to bond the film-removed region 24 and the slider 21. Another adhesive resin is applied dropwise at other positions on the slider-bonding surface 22 to enhance the adhesive strength of the slider 21. The above steps are preferably performed in an inert atmosphere.

The laser light L is strong enough to remove the oxide film 20X completely or incompletely, but not enough to perforate the flexure 20b. The laser light L has a spot diameter allowing a sufficient decrease in the contact resistance between the flexure 20b and the slider 21. Specifically, perpendicular irradiation with a laser of about 2 to 800 mJ/cm$^2$ is effective for a stainless-steel flexure 20b with a thickness of about 30 µm. Irradiation with a laser of 1000 mJ/cm$^2$ or more perforates the flexure 20b. The laser irradiation may be carried out in one or several steps according to its strength and spot diameter.

Figure 6:
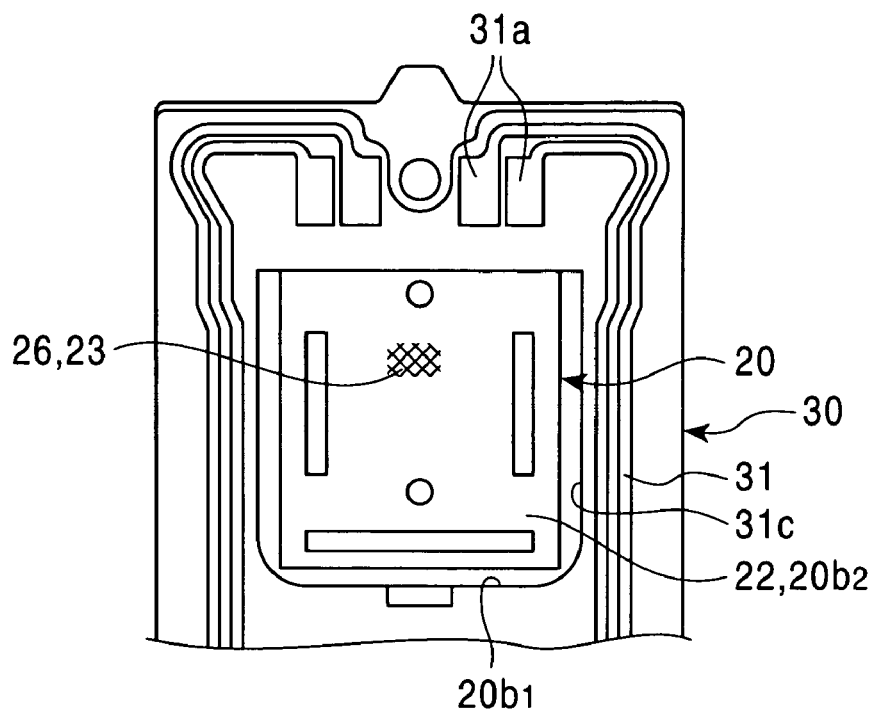
FIG. 6 is a back view similar to FIG. 4 of another embodiment of the present invention.

FIG. 6 shows another embodiment of the present invention. In this embodiment, the film-removed region 24 is formed at a predetermined position on the slider-bonding surface 22 by mechanical scratching instead of the laser irradiation. If a scratch 26 is formed on the slider-bonding surface 22 in the atmosphere, the conductive adhesive resin 25 is applied dropwise onto the scratch 26 to bond the slider 21 to the scratch 26 as soon as possible after the scratching. The slider-bonding surface 22 may be scratched and bonded to the slider 21 with the conductive adhesive resin 25 in an inert atmosphere to prevent re-formation of an oxide film on the scratch 26.

Figure 7A:
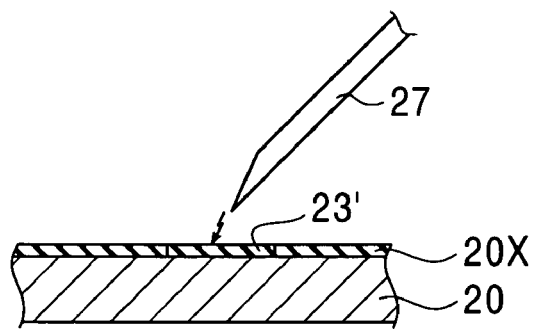
FIGS. 7A and 7B are sectional views similar to FIGS. 5A, 5B, and 5C of still another embodiment of the present invention.
Figure 7B:
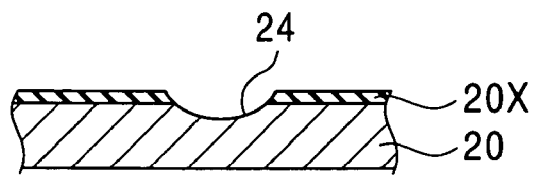

FIG. 7 is a schematic illustration of still another embodiment, in which the film-removed region 24 is formed by electrical discharge instead of the laser irradiation. In this embodiment, the oxide film 20X on the flexure 20b is completely or incompletely removed at a discharge region 23' to form the film-removed region 24 by bringing a discharge rod 27 close to the discharge region 23' while applying a discharge voltage between the discharge rod 27 and the flexure 20b. The discharge and the subsequent bonding, as well as the laser irradiation, are preferably performed in an inert atmosphere.

The bonding will now be described in detail. While the gimbal suspension 20 is fixed on a fixture, a predetermined amount of the conductive adhesive resin 25 is applied dropwise onto the film-removed region 24. On the other hand, the slider 21, while fixed on another fixture, is positioned and bonded to the flexure 20b (the slider-bonding tongue 20b2). The conductive adhesive resin 25 may be applied on the corresponding position of the slider 21 to the film-removed region 24, instead of the film-removed region 24.

The shape and structure of the flexure 20b (the gimbal suspension 20) shown in the above embodiments are merely examples of the present invention and do not limit the scope of the present invention. A variety of flexures (gimbal suspensions) having different shapes or structures are applicable in the present invention.

What is claimed is:

1. A head gimbal assembly comprising a gimbal suspension that includes a metal flexure bonded to a slider having a magnetic head element, wherein
   a region of an oxide film on a slider-bonding surface of the flexure is at least partially removed to form a film-removed region, and
   conductive adhesive resin is disposed between the film-removed region and the slider.

2. A head gimbal assembly according to claim 1, wherein the film-removed region is formed by mechanical scratching.

3. A head gimbal assembly according to claim 1, wherein the film-removed region is formed by laser irradiation or electrical discharge in an inert atmosphere.

4. A head gimbal assembly according to claim 3, wherein the flexure and the slider are bonded with the conductive adhesive resin in the inert atmosphere for the laser irradiation or the electrical discharge.

5. A head gimbal assembly according to claim 1, wherein the flexure has a U-shaped through groove forming a tongue on which the slider is disposed.

6. A head gimbal assembly according to claim 1, wherein the oxide film is adjacent to the film-removed region.

7. A head gimbal assembly according to claim 1, wherein the flexure that forms the film-removed region is thinner than a portion of the flexure that does not form the film-removed region.

8. A head gimbal assembly according to claim 1, wherein the film-removed region is substantially smaller than the slider.

9. A head gimbal assembly according to claim 1, wherein no perforations in the flexure are present in the film-removed region.

10. A head gimbal assembly according to claim 1, wherein the oxide film on the slider-bonding surface of the flexure is completely removed.

11. A head gimbal assembly comprising:
    a slider comprising a magnetic head element;
    a metal flexure comprising an oxide film, the metal flexure having a slider-bonding surface; and
    a conductive adhesive resin,
    wherein the slider-bonding surface comprises a film-removed region and the conductive adhesive resin is disposed between the film-removed region and the slider.

12. A head gimbal assembly of claim 11, wherein the slider-bonding surface does not comprise oxide film.

13. A head gimbal assembly according to claim 11, wherein the film-removed region is formed by mechanical scratching.

14. A head gimbal assembly according to claim 11, wherein the film-removed region is formed by laser irradiation or electrical discharge in an inert atmosphere.

15. A head gimbal assembly according to claim 14, wherein the flexure and the slider are bonded with the conductive adhesive resin in the inert atmosphere for the laser irradiation or the electrical discharge.

16. A head gimbal assembly according to claim 11, wherein the flexure has a U-shaped through groove forming a tongue on which the slider is disposed.

17. A head gimbal assembly according to claim 11, wherein a region of the oxide film region is adjacent to the film-removed region.

18. A head gimbal assembly according to claim 11, wherein a region of the flexure comprising the film-removed region is thinner than a region of the flexure that does not comprise the film-removed region.

19. A head gimbal assembly according to claim 11, wherein the film-removed region is substantially smaller than the slider.

20. A head gimbal assembly according to claim 11, wherein the film-removed region does not contain perforations.

* * * * *